(12) United States Patent
Nishihara et al.

(10) Patent No.: US 7,579,761 B2
(45) Date of Patent: Aug. 25, 2009

(54) PIEZOELECTRIC THIN-FILM RESONATOR AND FILTER

(75) Inventors: Tokihiro Nishihara, Kawasaki (JP); Tsuyoshi Yokoyama, Kawasaki (JP); Shinji Taniguchi, Kawasaki (JP); Takeshi Sakashita, Kawasaki (JP); Jun Tsutsumi, Kawasaki (JP); Masafumi Iwaki, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/430,184

(22) Filed: May 9, 2006

(65) Prior Publication Data

US 2006/0255693 A1 Nov. 16, 2006

(30) Foreign Application Priority Data

May 10, 2005 (JP) .............................. 2005-137877

(51) Int. Cl.
*H01L 41/047* (2006.01)

(52) U.S. Cl. ........................ 310/364; 310/320; 310/324; 310/363

(58) Field of Classification Search ................. 310/312, 310/363–365, 320, 324
See application file for complete search history.

(56) References Cited

U.S. PATENT DOCUMENTS

| | | | | |
|---|---|---|---|---|
| 4,211,947 A | * | 7/1980 | Ikeno et al. ................. | 310/312 |
| 5,235,240 A | * | 8/1993 | Morita et al. ............... | 310/365 |
| 5,268,610 A | * | 12/1993 | Hadimioglu et al. ... | 310/323.01 |
| 6,232,699 B1 | | 5/2001 | Wajima | |
| 6,291,931 B1 | | 9/2001 | Lakin | |
| 6,414,569 B1 | * | 7/2002 | Nakafuku .................... | 333/188 |
| 6,933,809 B2 | * | 8/2005 | Kyoung et al. .............. | 333/193 |
| 7,180,224 B2 | * | 2/2007 | Bouche et al. .............. | 310/320 |
| 7,211,931 B2 | * | 5/2007 | Nishihara et al. ........... | 310/324 |
| 7,482,737 B2 | * | 1/2009 | Yamada et al. .............. | 310/363 |
| 2003/0127946 A1 | * | 7/2003 | Yamada et al. .............. | 310/324 |
| 2006/0244553 A1 | * | 11/2006 | Yokoyama et al. .......... | 333/191 |

FOREIGN PATENT DOCUMENTS

| | | |
|---|---|---|
| CN | 1252646 | 5/2000 |
| EP | 0 486 182 | 5/1992 |
| JP | 10-264385 | * 10/1998 |
| JP | 2001-211052 | 8/2001 |
| JP | 2003-179452 | * 6/2003 |
| JP | 2005-333619 | * 12/2005 |
| KR | 10-2005-0034226 | 4/2005 |
| WO | WO-2004-055982 | * 7/2004 |

OTHER PUBLICATIONS

Chinese Office Action, dated Jul. 11, 2008, 12 pages.
H.P. Löbl et al., "Piezoelectric Materials For BAW Resonators And Filters", 2001, pp. 807-811, IEEE Ultrasonics Symposium, United States of America.

* cited by examiner

*Primary Examiner*—Thomas M Dougherty
(74) *Attorney, Agent, or Firm*—Arent Fox LLP.

(57) ABSTRACT

A piezoelectric thin-film resonator includes: a lower electrode that is formed on a substrate; a piezoelectric film that is formed on the lower electrode; and an upper electrode that is formed on the piezoelectric film. In the piezoelectric thin-film resonator, the upper electrode has a greater film thickness than the lower electrode.

9 Claims, 6 Drawing Sheets

— EMBODIMENT
----- COMPARATIVE EXAMPLE

PIEZOELECTRIC THIN-FILM RESONATOR AND FILTER

BACKGROUND OF THE INVENTION

1. Field of the Invention

The present invention generally relates to piezoelectric thin-film resonators and filters, and more particularly, to a piezoelectric thin-film resonator having an upper electrode and a lower electrode overlapping each other and a piezoelectric film interposed between the upper electrode and the lower electrode, and a filter formed with such piezoelectric thin-film resonators.

2. Description of the Related Art

Due to the rapid spread of high-frequency wireless devices such as portable telephone devices, there is an increasing demand for small-sized, lightweight high-frequency filters to be used at high frequencies from 900 MHz to 5 GHz. In such fields, filters formed mainly with surface acoustic wave devices are used. Recently, attention has been drawn to piezoelectric thin-film resonators as devices that exhibit excellent characteristics especially at high frequencies, and can be made smaller in size and turned into monolithic types. Filters that include those piezoelectric thin-film resonators have also been drawing attention.

Examples of piezoelectric thin-film resonators include resonators of a FBAR (Film Bulk Acoustic Resonator) type and a SMR (Solidly Mounted Resonator) type. A piezoelectric thin-film resonator of the FBAR type is disclosed in FIG. 1 of U.S. Pat. No. 6,291,931 (hereinafter referred to as "Patent Document 1"). In this piezoelectric thin-film resonator, an upper electrode and a lower electrode are provided on both sides of a piezoelectric film. The region in which the upper electrode and the lower electrode sandwiching the piezoelectric film face each other is a membrane region. Although not shown in the drawings of Patent Document 1, the lower electrode, the piezoelectric film, and the upper electrode are formed on a substrate, and a void is formed in the substrate immediately below the region in which the lower electrode and the upper electrode face each other. The void is formed by etching the substrate from its bottom face. Alternatively, the void may be formed through the upper surface, using a sacrifice layer. A piezoelectric thin-film resonator of the SMR type is disclosed in FIG. 2 of Patent Document 1. Instead of the void in the substrate, an acoustic reflection film formed by alternately stacking films with high acoustic impedance and films with low acoustic impedance is used, and the film thickness of the acoustic reflection film is ¼ of the wavelength of the elastic wave.

In each of the above piezoelectric thin-film resonators, a high-frequency electric signal is supplied between the upper electrode and the lower electrode, so as to excite an elastic wave in the piezoelectric film by virtue of an inverse piezoelectric effect. At the same time, due to a piezoelectric effect, the distortion caused by the elastic wave is converted into an electric signal. This elastic wave is totally reflected by the faces of the upper electrode and the lower electrode in contact with the air. Resonance is caused at such a frequency that the total film thickness H of the upper electrode, the piezoelectric film, and the lower electrode is an integral multiple (n times) of ½ of the wavelength of the elastic wave. Where the propagation speed of the elastic wave that is determined by the material is represented by V, the resonant frequency F is expressed as: $F = nV/2H$. In this manner, the resonant frequency is controlled by adjusting the film thicknesses. Thus, a piezoelectric thin-film resonator with desired frequency characteristics can be obtained.

A ladder filter is a bandpass filter that has a predetermined passband region and has piezoelectric thin-film resonators arranged in series arms and parallel arms in a ladder-like fashion.

As a large amount of information is being handled today, high-frequency wireless devices are strongly expected to employ broadband filters. To provide broadband devices, resonators each having a high electromechanical coupling coefficient ($k^2$) are necessary. Therefore, the following conventional techniques have been suggested.

By the first conventional technique, the piezoelectric film is made of lead zirconate titanate (PZT) or lead titanate (PbTiO$_3$), which has a higher electromechanical coupling coefficient than aluminum nitride (AlN) and zinc oxide (ZnO) and is widely used as piezoelectric ceramics (Prior Art 1).

By the second conventional technique, the orientation of the piezoelectric film is improved so as to increase the electromechanical coupling coefficient (Prior Art 2). For example, the relationship between the piezoelectric film orientation and the electromechanical coupling coefficient in a case where the piezoelectric film is made of aluminum nitride is disclosed in "Piezoelectric Materials for BAW Resonators and Filters (H. P. Lobl, et al., pp 807-811, 2001 IEEE Ultrasonics Symposium, IEEE, the United States)".

By the third conventional technique, the electromechanical coefficient is increased by controlling the film thickness ratio of the piezoelectric film to the upper electrode and the lower electrode (Prior Art 3). For example, Patent Document 1 discloses the relationship between the electromechanical coupling coefficient and the ratio of the film thickness of the piezoelectric film to the sum of the film thicknesses of the upper electrode and the lower electrode in a case where the upper electrode and the lower electrode are made of tungsten, aluminum, gold, or copper.

In accordance with Prior Art 1, however, it is difficult to form a high-quality thin film of PZT or PbTiO$_3$, and practical resonant characteristics cannot be obtained. In accordance with Prior Art 2, to obtain a piezoelectric film having a suitable orientation for an increase in the electromechanical coupling coefficient, a number of control and management operations are required to control and manage the material for the base of the piezoelectric film, the surface roughness of the base, and the conditions for forming the piezoelectric film. If those control and management operations are inadequate, the orientation might become unstable in the wafer plane and between lots, resulting in unstable resonant characteristics. In accordance with Prior Art 3, to increase the electromechanical coupling coefficient, the ratio of the film thickness of the piezoelectric film to the sum of the film thicknesses of the upper electrode and the lower electrode needs to be low. However, as the upper electrode and the lower electrode become thinner, the electrode resistance increases, resulting in tradeoff for insertion loss.

SUMMARY OF THE INVENTION

It is therefore an object of the present invention to provide a piezoelectric thin-film resonator and filter in which the above disadvantages are eliminated.

A more specific object of the present invention is to provide a piezoelectric thin-film resonator that has an electromechanical coupling coefficient that is made higher by a simple method, without degradation of the other characteristics. Another specific object of the present invention is to provide a filter that is formed with such piezoelectric thin-film resonators.

According to an aspect of the present invention, there is provided a piezoelectric thin-film resonator including: a lower electrode that is formed on a substrate; a piezoelectric film that is formed on the lower electrode; and an upper electrode that is formed on the piezoelectric film, the upper electrode having a greater film thickness than the lower electrode.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1A:
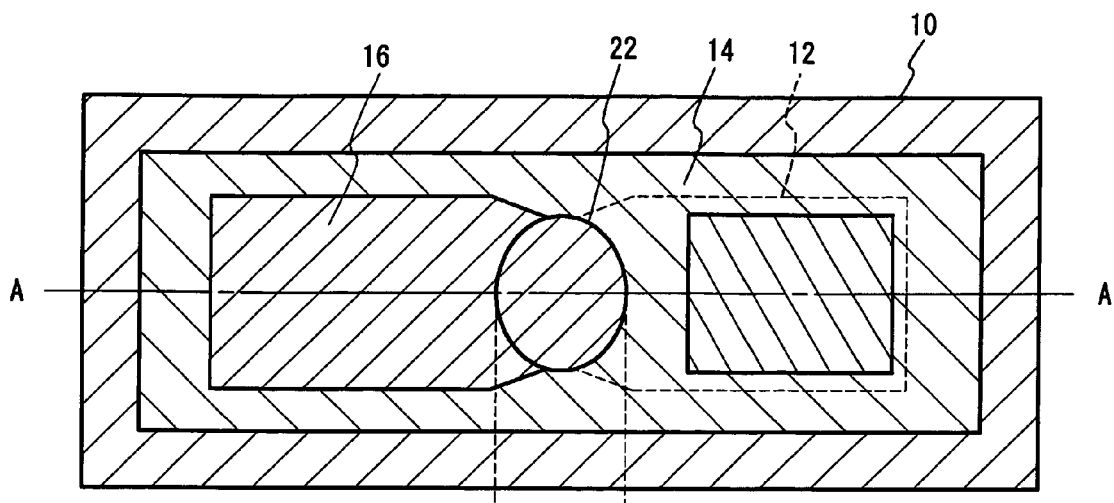
FIG. 1A is a top view of a piezoelectric thin-film resonator in accordance with a first embodiment of the present invention.
Figure 1B:
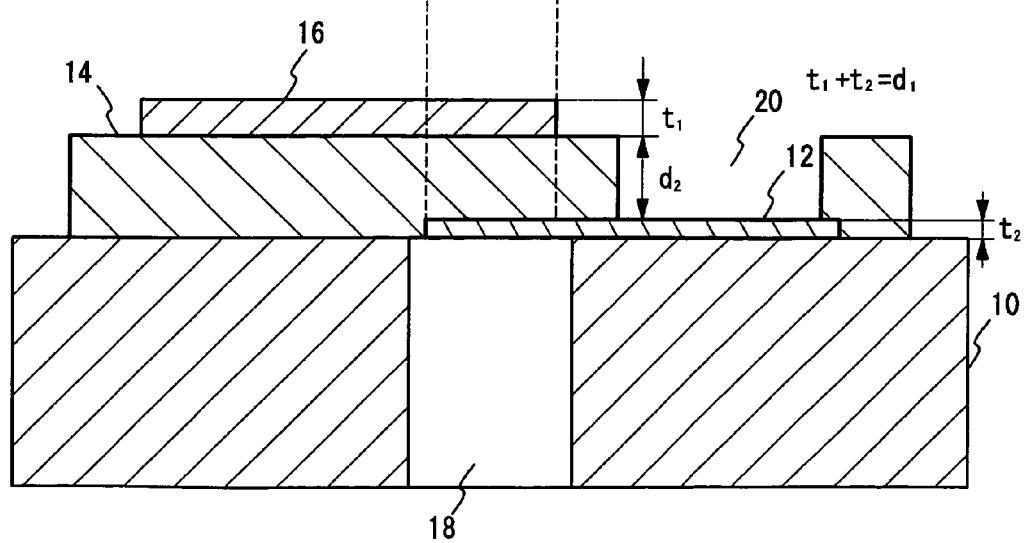
FIG. 1B is a cross-sectional view of the piezoelectric thin-film resonator, taken along the line A-A.

A first embodiment of the present invention is an example of a piezoelectric thin-film resonator having a resonant frequency of approximately 2 GHz. FIGS. 1A and 1B illustrate the structure of the piezoelectric thin-film resonator in accordance with the first embodiment. FIG. 1A is a top view of the piezoelectric thin-film resonator, and FIG. 1B is a cross-sectional view of the piezoelectric thin-film resonator, taken along the line A-A. This piezoelectric thin-film resonator includes a lower electrode 12 formed on a substrate 10, a piezoelectric film 14 formed on the lower electrode 12, and an upper electrode formed on the piezoelectric film 14. The piezoelectric film 14 has such an opening 20 as to electrically connect the lower electrode 12 to the piezoelectric film 14. A void 18 is formed in the substrate 10 immediately below a region (a membrane region) 22 in which the upper electrode 16 and the lower electrode 12 face each other. The void 18 is slightly larger than the region 22. The thicknesses of the upper electrode 16, the piezoelectric film 14, and the lower electrode 12 are t1, d2, and t2, respectively, with d1 being t1+t2. The region 22 in which the upper electrode 16 and the lower electrode 12 face each other has an oval shape of 228×163 µm.

Next, the method of manufacturing the piezoelectric thin-film resonator is described. First, a molybdenum (Mo) film is formed as the lower electrode 12 on the silicon substrate 10 by sputtering. The lower electrode 12 is then completed by removing a predetermined portion from the molybdenum film by a conventional exposure technique and etching technique. An aluminum nitride (AlN) film having an orientation, the principal axis being (002) direction, is formed as the piezoelectric film 14, and a molybdenum (Mo) film is formed by the upper electrode 16 by sputtering. The upper electrode 16 is then completed by removing a predetermined portion from the molybdenum film by a conventional exposure technique and etching technique.

A resist pattern for dry etching to form a via hole by a conventional exposure technique is then formed on the bottom face of the silicon substrate 10. Dry etching is performed on the silicon substrate 10, so as to form a via hole to be the void 18 in the substrate 10. The dry etching is performed by alternately repeating etching with $SF_6$ and sidewall protection film formation with $C_4F_8$. Through this procedure, the void 18 can be formed, with its side walls being substantially perpendicular to the upper and lower faces of the Si substrate 10. Thus, the piezoelectric thin-film resonator in accordance with the first embodiment is completed.

As examples of the piezoelectric thin-film resonator with this structure, a resonator 1 and a resonator 2 were manufactured under the conditions shown in Table 1. In each of the resonators, the film thickness of the piezoelectric film 14 is 1250 nm. In the resonator 1, the upper electrode 16 is thicker than the lower electrode 12, with the thickness of the upper electrode 16 being 320 nm; and the thickness of the lower electrode 12 being 260 nm. In the resonator 2, on the other hand, the upper electrode 16 and the lower electrode 12 have the same thickness of 290 nm. The resonators 1 and 2 were manufactured by the same manufacturing method, except for the different thicknesses of the upper electrode 16 and the lower electrode 12.

TABLE 1

| | Upper Electrode | | Piezoelectric Film | | Lower Electrode | |
|---|---|---|---|---|---|---|
| | Material | Film Thickness | Material | Film Thickness | Material | Film Thickness |
| Resonator 1 | Mo | 320 nm | AlN | 1250 nm | Mo | 260 nm |
| Resonator 2 | Mo | 290 nm | AlN | 1250 nm | Mo | 290 nm |

When the electromechanical coupling coefficient was evaluated with respect to both resonators 1 and 2, the resonator 1 exhibited an electromechanical coupling coefficient of 7.0%, and the resonator 2 exhibited an electromechanical coupling coefficient of 6.7%. In this manner, the electromechanical coupling coefficient can be increased by making the upper electrode 16 thicker than the lower electrode 12.

Second Embodiment

Figure 2:
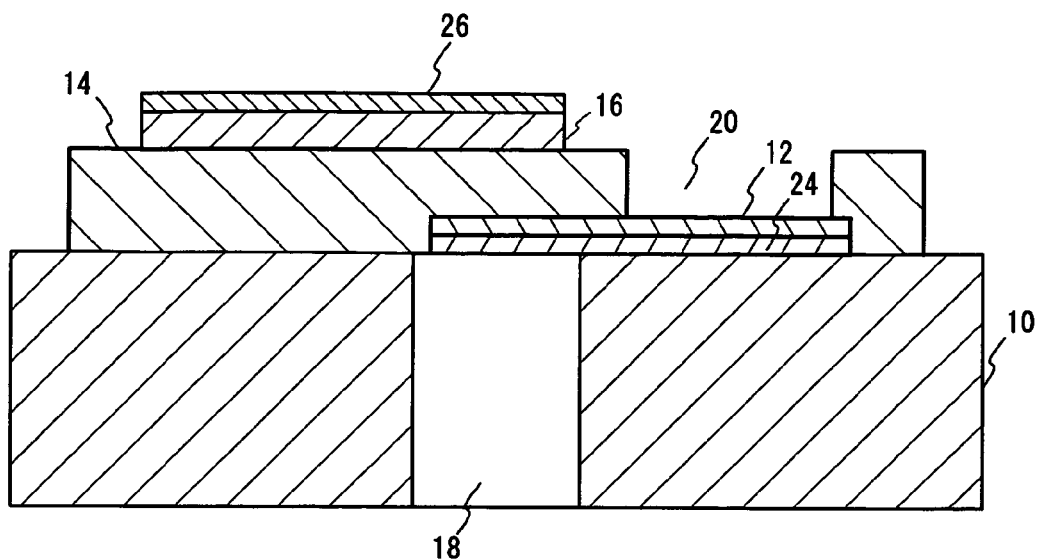
FIG. 2 is a cross-sectional view of a piezoelectric thin-film resonator in accordance with a second embodiment of the present invention.

A second embodiment is another example of a piezoelectric thin-film resonator having a resonant frequency of approximately 2 GHz. In this example structure, thin-film layers are provided on the upper electrode 16 and under the lower electrode 12, and the material for each electrode is replaced with ruthenium. FIG. 2 is a cross-sectional view of the piezoelectric thin-film resonator in accordance with the second embodiment. This piezoelectric thin-film resonator is the same as the piezoelectric thin-film resonator of the first embodiment, except that the lower electrode 12 and the upper electrode 16 are made of ruthenium, a lower thin-film layer 24 is formed under the lower electrode 12, an upper thin-film layer 26 is formed on the upper electrode 16, and the region in which the upper electrode 16 faces the lower electrode 12 has an oval shape of 248×177 μm.

As examples of piezoelectric thin-film resonators each having this structure, a resonant 1, a resonant 2, and a resonant 3 were manufactured under the conditions shown in Table 2. In each resonator, the film thickness of the piezoelectric film 14 is 1150 nm, the upper thin-film layer 26 is made of chromium and has a film thickness of 20 nm, and the lower thin-film layer 24 is made of chromium and has a film thickness of 100 nm. In the resonator 1, the upper electrode 16 is thicker than the lower electrode 12, with the film thickness of the upper electrode 16 being 263 nm, and the film thickness of the lower electrode 12 being 237 nm. In the resonator 2, the upper electrode 16 and the lower electrode 12 have the same film thickness of 250 nm. In the resonator 3, the upper electrode 16 is thinner than the lower electrode 12, with the film thickness of the upper electrode 16 being 237 nm, and the film thickness of the lower electrode 12 being 263 nm. The resonators 1, 2, and 3 were manufactured by the same manufacturing method, except for the different film thicknesses of the upper electrode 16 and the lower electrode 12.

When the electromechanical coupling coefficient was evaluated with respect to the three resonators 1, 2, and 3, the resonator 1 exhibited an electromechanical coupling coefficient of 7.0%, the resonator 2 exhibited an electromechanical coupling coefficient of 6.8%, and the resonator 3 exhibited an electromechanical coupling coefficient of 6.7%. In this manner, the electromechanical coupling coefficient can be increased by making the upper electrode 16 thicker than the lower electrode 12.

Third Embodiment

Figure 3:
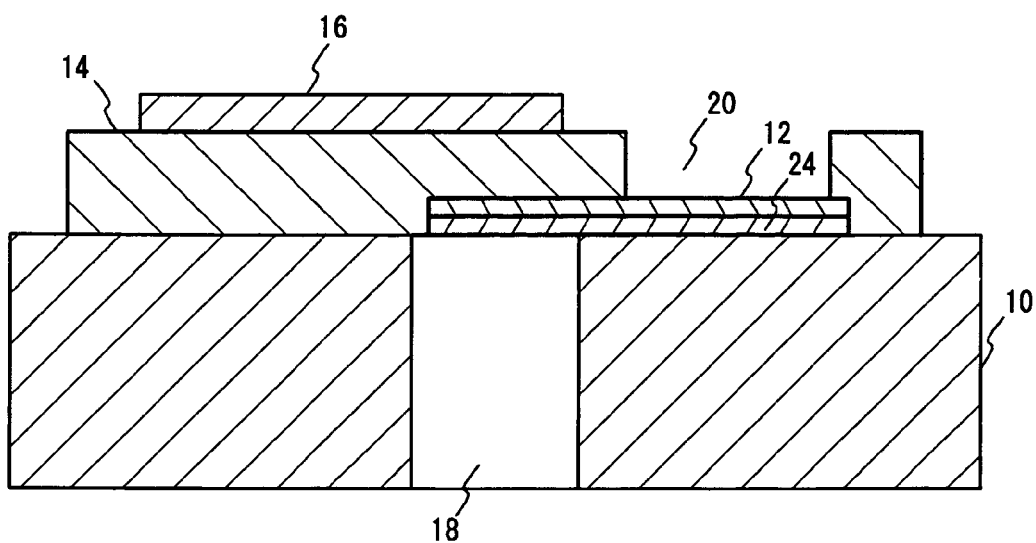
FIG. 3 is a cross-sectional view of a piezoelectric thin-film resonator in accordance with a third embodiment of the present invention.

A third embodiment is yet another example of a piezoelectric thin-film resonator having a resonant frequency of approximately 2 GHz. In this example structure, the upper electrode 16 and the lower electrode 12 are made of ruthenium, and a thin-film layer 24 is provided under the lower electrode 12. FIG. 3 is a cross-sectional view of the piezoelectric thin-film resonator in accordance with the third embodiment. This embodiment is the same as the second embodiment, except that the upper thin-film layer 26 is not formed on the upper electrode 16. In other words, the thin-film layer 24 is provided under the lower electrode 12, while the thin-film layer 26 is not provided on the upper electrode 16.

As examples of piezoelectric thin-film resonators each having this structure, a resonant 1 and a resonant 2 were manufactured under the conditions shown in Table 3. In each resonator, the lower thin-film layer 24 is made of chromium and has a film thickness of 50 nm. The resonator 1 was designed so that the film thickness of the upper electrode 16 was t1 nm, the film thickness of the lower electrode 12 was t2 nm, the film thickness of the piezoelectric film 14 was 1210 nm, and t1+t2 was 500 nm. The resonator 2 was designed so that the film thickness of the upper electrode 16 was t1 nm, the film thickness of the lower electrode 12 was t2 nm, the film thickness of the piezoelectric film 14 was d2 nm, and t1/t2 was 1.1. The sum of the film thicknesses of the upper electrode 16 and the lower electrode 12, which is t1+t2, was d1.

TABLE 2

| | Upper Thin-Film Layer | | Upper Electrode | | Piezoelectric Film | | Lower Electrode | | Lower Thin-Film Layer | |
|---|---|---|---|---|---|---|---|---|---|---|
| | Material | Film Thickness | Material | Film Thickness | Material | Film Thickness | Material | Film Thickness | Material | Film Thickness |
| Resonator 1 | Cr | 20 nm | Ru | 263 nm | AlN | 1150 nm | Ru | 237 nm | Cr | 100 nm |
| Resonator 2 | Cr | 20 nm | Ru | 250 nm | AlN | 1150 nm | Ru | 250 nm | Cr | 100 nm |
| Resonator 3 | Cr | 20 nm | Ru | 237 nm | AlN | 1150 nm | Ru | 263 nm | Cr | 100 nm |

TABLE 3

| | Upper Electrode | | Piezoelectric Film | | Lower Electrode | | Lower Thin-Film Layer | | |
|---|---|---|---|---|---|---|---|---|---|
| | Material | Film Thickness | Material | Film Thickness | Material | Film Thickness | Material | Film Thickness | Notes |
| Resonator 1 | Ru | t1 nm | AlN | 1210 nm | Ru | t2 nm | Cr | 50 nm | t1 + t2 = 500 nm |
| Resonator 2 | Ru | t1 nm | AlN | d2 nm | Ru | t2 nm | Cr | 50 nm | t1/t2 = 1.1 |

Figure 4:
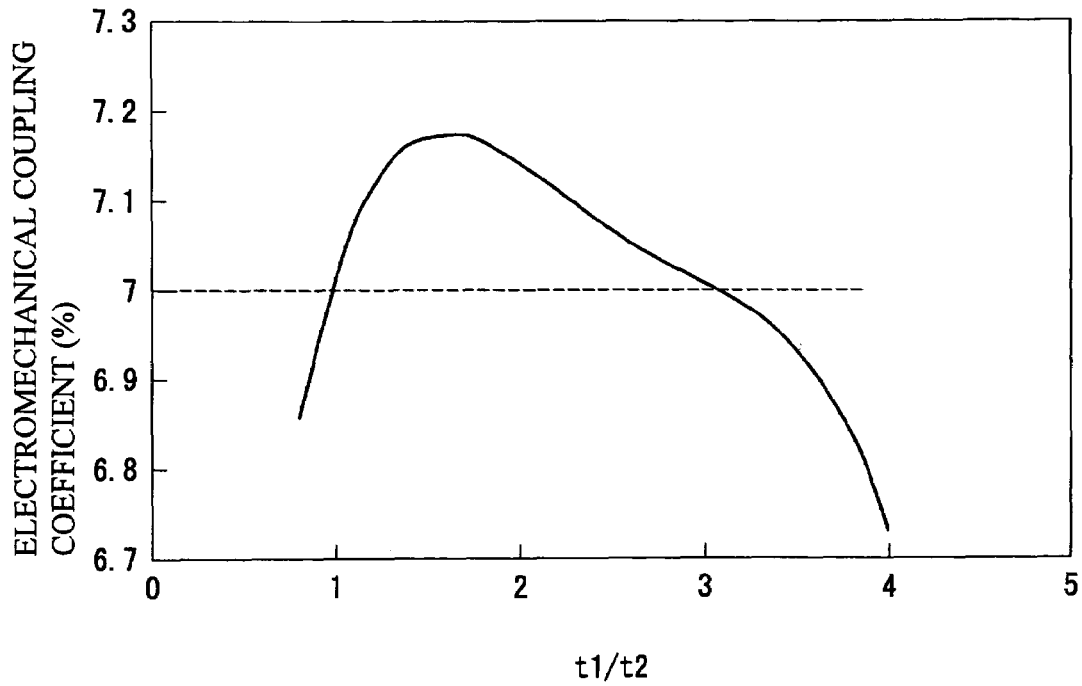
FIG. 4 shows the electromechanical coupling coefficient in relation to t1/t2 in a piezoelectric thin-film resonator in accordance with the third embodiment.

FIG. 4 shows the relationship between the electromechanical coupling coefficient and t1/t2 in the resonator 1. As t1/t2 becomes larger, the electromechanical coupling coefficient becomes higher, and starts decreasing at approximately 1.6. The electromechanical coupling coefficient is 7.0%, where the upper electrode 16 and the lower electrode 12 have the same film thickness: t1/t2=1. The electromechanical coupling coefficient is lower than 7.0%, where t1/t2 is larger than 3. Accordingly, the relationship should preferably be set as 1<t1/t2<3, so as to obtain an electromechanical coupling coefficient of 7.0% or higher. More preferably, t1/t2 should be larger than 1.1 but smaller than 2.6, so as to obtain an electromechanical coupling coefficient of 7.05% or higher. Even more preferably, t1/t2 should be larger than 1.2 but smaller than 2.3, so as to obtain an electromechanical coupling coefficient of 7.1% or higher.

Figure 5:
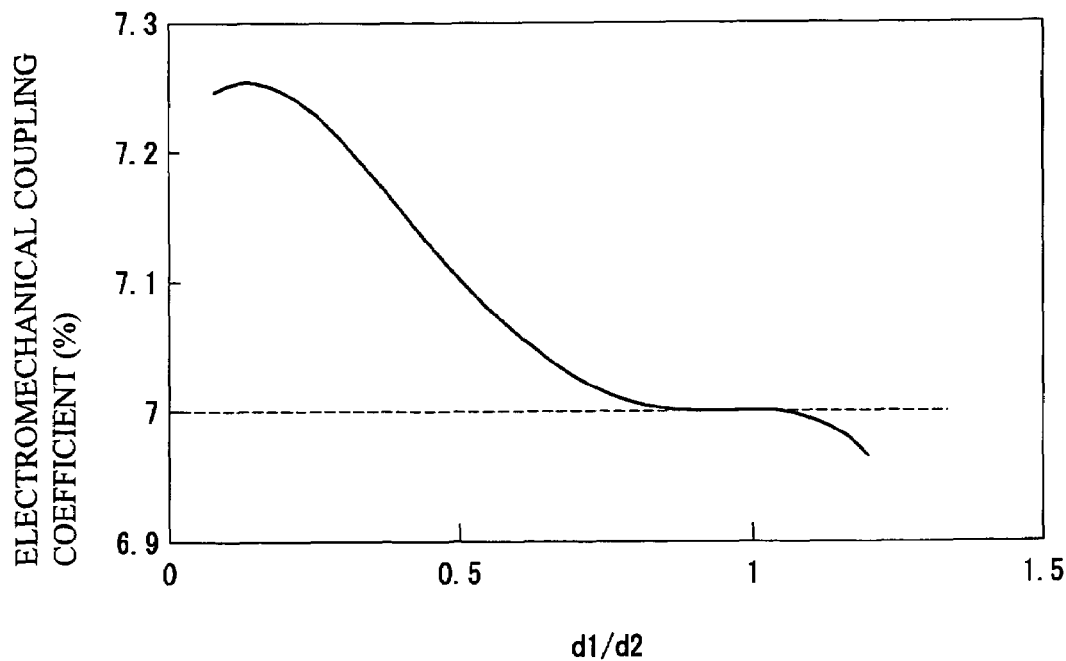
FIG. 5 shows the electromechanical coupling coefficient in relation to d1/d2 in a piezoelectric thin-film resonator in accordance with the third embodiment.

FIG. 5 shows the relationship between the electromechanical coupling coefficient and d1/d2 in the resonator 2. As shown in FIG. 5, as d1/d2 becomes smaller, the electromechanical coupling coefficient becomes higher. As in the resonator 1, to obtain an electromechanical coupling coefficient of 7.0% or higher, d1/d2 should preferably be smaller than 1. More preferably, d1/d2 should be smaller than 0.7, so as to obtain an electromechanical coupling coefficient of 7.05% or higher. Even more preferably, d1/d2 should be smaller than 0.5, so as to obtain an electromechanical coupling coefficient of 7.1% or higher.

Figure 6:
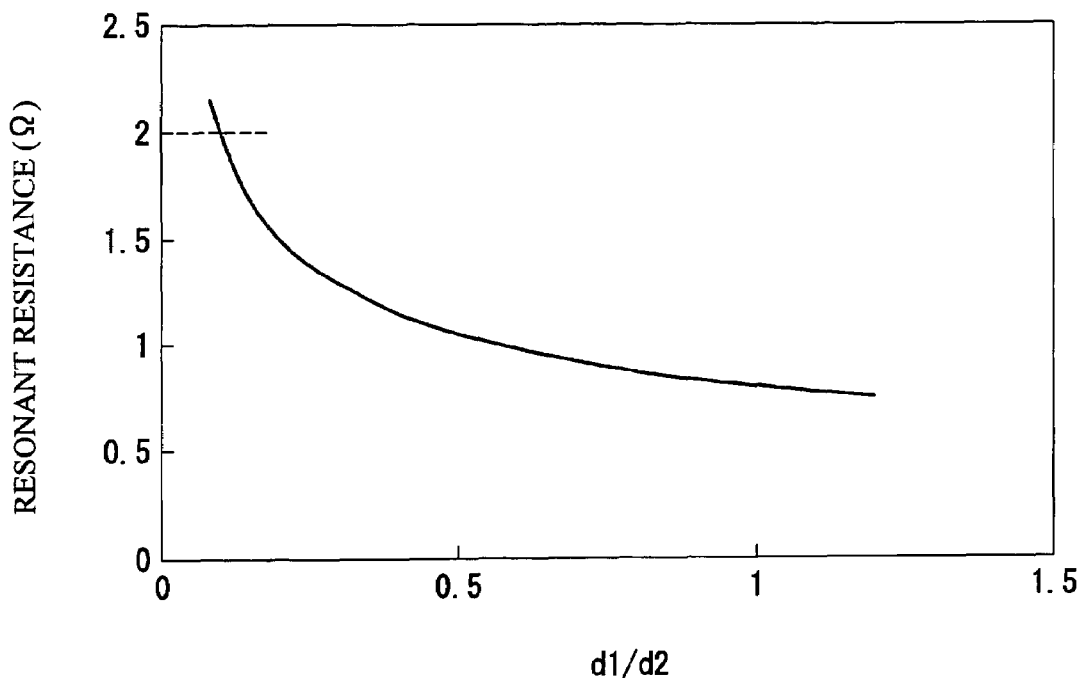
FIG. 6 shows the resonant resistance in relation to d1/d2 in a piezoelectric thin-film resonator in accordance with the third embodiment.

FIG. 6 shows the relationship between the resonant resistance and d1/d2 in the resonator 2. As the resonant resistance becomes higher, insertion loss becomes larger. As shown in FIG. 6, as d1/d2 becomes smaller, the resonant resistance becomes higher. This is because, when d1/d2 becomes smaller, the film thicknesses of the upper electrode 16 and the lower electrode 12 become relatively thinner. If d1/d2 becomes 0.1 or smaller, the resonant resistance rapidly increases to exceed 2Ω, and the insertion loss also increases. Therefore, d1/d2 should preferably be larger than 0.1. More preferably, d1/d2 should be larger than 0.2, since the resonant resistance increases to exceed 1.5Ω if d1/d2 becomes 0.2 or smaller. Even more preferably, d1/d2 should be larger than 0.5, since the resonant resistance gradually increases to exceed 1Ω if d1/d2 becomes 0.5 or smaller.

As described above, the upper electrode 16 and the lower electrode 12 mostly contain ruthenium, and d1/d2 is made larger than 0.1 but smaller than 1. Thus, the resonant resistance can be restrained, and a higher electromechanical coupling coefficient can be obtained.

Figure 7:
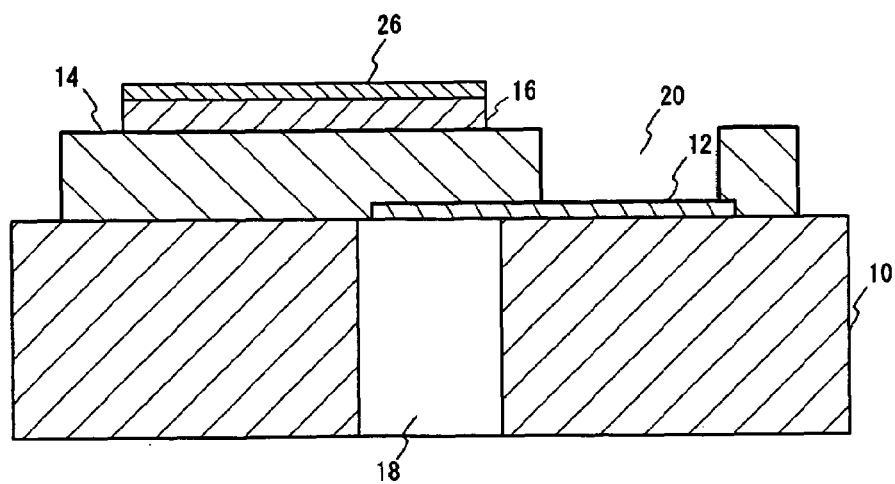
FIG. 7 is a cross-sectional view of a piezoelectric thin-film resonator as a modification of the second or third embodiment.

FIG. 7 is a cross-sectional view of a piezoelectric thin-film resonator as a modification of the second or third embodiment. In this piezoelectric thin-film resonator, a thin-film layer 26 is provided on the upper electrode 16, but a thin-film layer is not provided under the lower electrode 12. The other aspects of the structure are the same as those of the second and third embodiments. In this structure, a higher electromechanical coupling coefficient can also be obtained by making the film thickness of the upper electrode 16 larger than the film thickness of the lower electrode 12.

In the second and third embodiments and their modification, the electromechanical coupling coefficient can be increased by making the film thickness of the upper electrode 16 larger than the film thickness of the lower electrode 12, even if a thin-film layer is provided at least in either a region under the lower electrode 12 or a region on the upper electrode 16. The lower thin-film layer 24 is a metal film or an insulating film that serves as an etching stopper layer in the case of forming the void 18 in the substrate 10, an orientation control layer having its surface controlled to adjust the orientation of the piezoelectric film 14, or a reinforcing layer that reinforces the region in which the upper electrode 16 and the lower electrode 12 face each other. The upper thin-film layer 26 is a metal film or an insulating film that serves as a frequency adjusting film for adjusting the resonant frequency, or a protection film for protecting the piezoelectric thin-film resonator. In the second and third embodiments, the upper thin-film layer 26 is a frequency adjusting film, and the lower thin-film layer 24 is an etching stopper layer.

In the first, second, and third embodiments, the electromechanical coupling coefficient can be increased by making the film thickness of the upper electrode 16 larger than the film thickness of the lower electrode 12, regardless of the materials of the upper electrode 16 and the lower electrode 12. Also, a higher electromechanical coupling coefficient can be obtained where 1<t1/t2<3. As will be further shown in a fourth embodiment, the insertion loss does not increase. Thus, simply by making the film thickness of the upper electrode larger than the film thickness of the lower electrode, a piezoelectric thin-film resonator with a higher electromechanical coupling coefficient can be provided, without any degradation of characteristics.

The reason why the electromechanical coupling coefficient can be increased by making the upper electrode 16 thicker than the lower electrode 12 is not clear. However, it may be that the center of the standing wave in the stacked film structure of the lower electrode 12, the piezoelectric film 14, and the upper electrode 16 resonating with one another is slightly off to the bottom from the middle, and can made closer to the center of the piezoelectric film 14 by increasing the film thickness of the upper electrode 16.

Fourth Embodiment

Figure 8A:
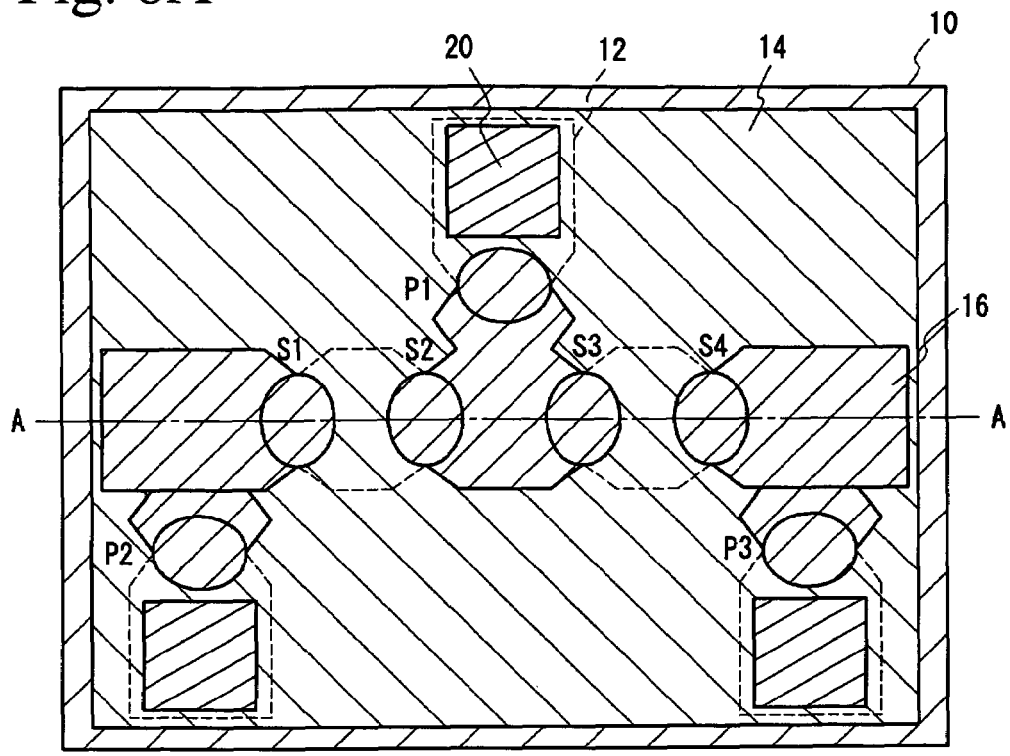
FIG. 8A is a top view of a filter in accordance with a fourth embodiment of the present invention.
Figure 8B:
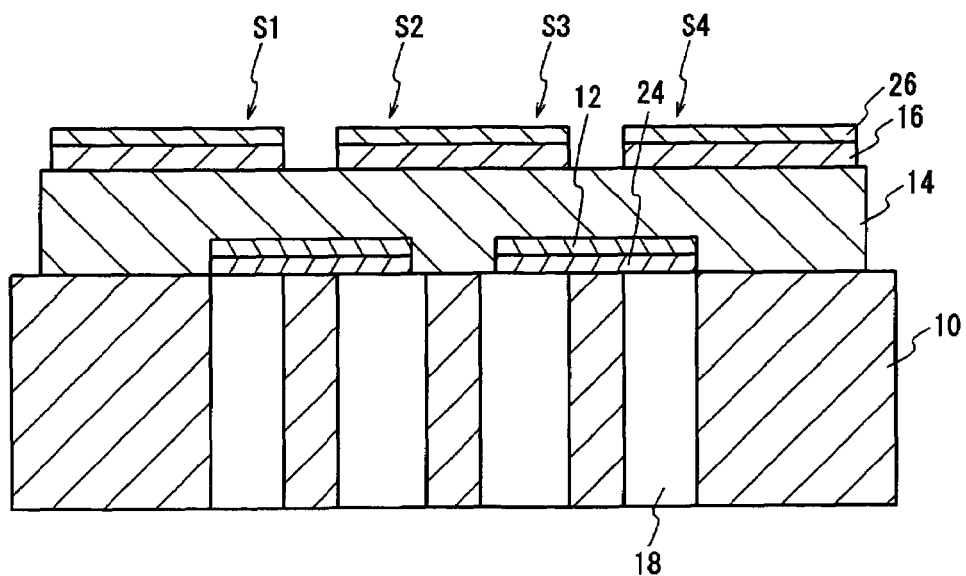
FIG. 8B is a cross-sectional view of the filter in accordance with the fourth embodiment.

The fourth embodiment is an example of a ladder filter that includes the resonator 1 manufactured in accordance with the second embodiment. This filter includes piezoelectric thin-film resonators. As a comparative example, a ladder filter that includes the resonator 2 manufactured in conjunction with the second embodiment was also formed. FIGS. 8A and 8B illustrate the structure of the filter in accordance with the fourth embodiment and the comparative example. FIG. 8A is a top view of the filter, and FIG. 8B is a cross-sectional view of the filter, taken along the line A-A. The same components as those of the second embodiment are denoted by the same reference numerals as those of the second embodiment. The structure of each resonator in this embodiment is the same as that of the second embodiment, except for the film thickness of the upper thin-film layer 26. Piezoelectric thin-film resonators S1, S2, S3, and S4 are arranged in series arms, and piezoelectric thin-film resonators P1, P2, and P3 are arranged in parallel arms. The film thickness of the upper thin-film layer 26 of each of the parallel-arm piezoelectric thin-film resonators P1, P2, and P3 is 100 nm, so that the resonant frequency of the parallel arms can be lower than the resonant frequency of the series arms. Thus, bandpass filter characteristics can be achieved.

Figure 9:
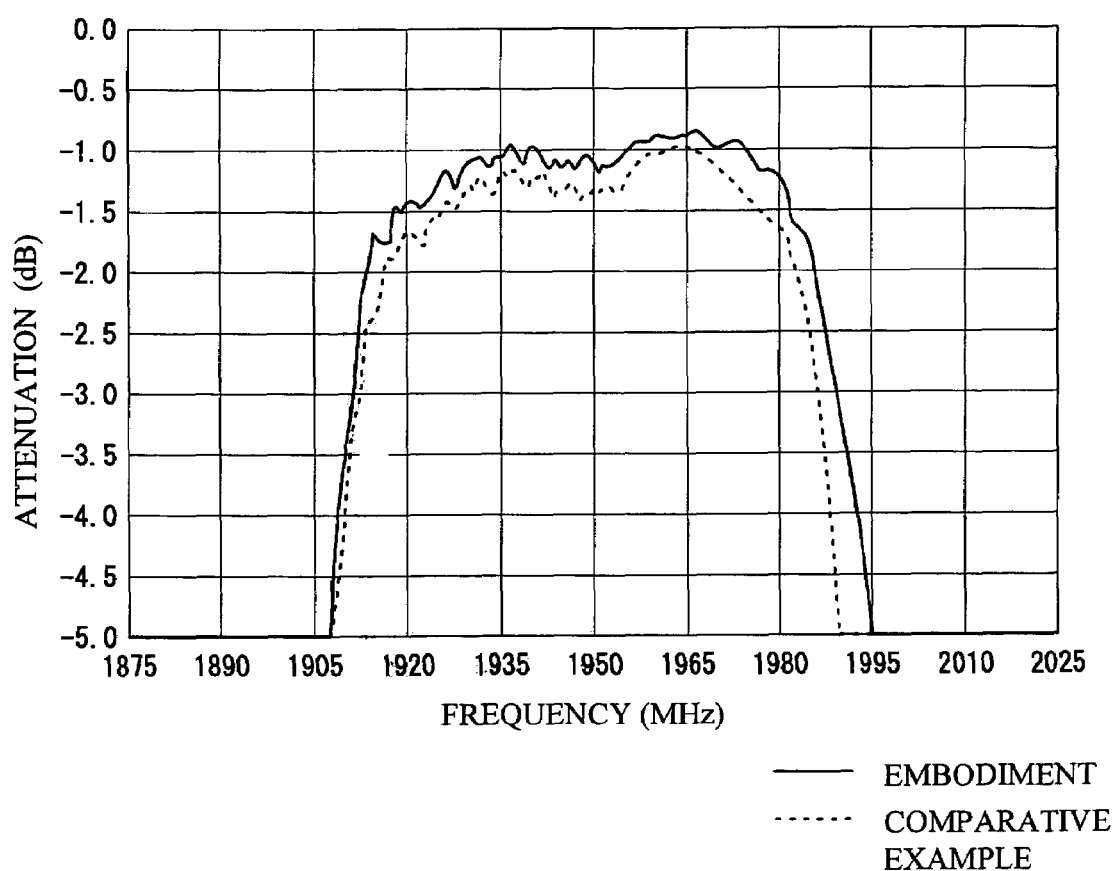
FIG. 9 shows the insertion loss in the neighborhood of the passband of the filter in accordance with the fourth embodiment.

FIG. 9 shows the insertion loss in the neighborhood of the passband of the fourth embodiment and the comparative example. In the graph, the solid line indicates the fourth embodiment, and the broken line indicates the comparative example. The width of the passband at 2 dB is 72.3 MHz in the fourth embodiment, and is 66.7 MHz in the comparative example. The insertion loss does not increase in the passband. This is because each resonator 1 of the second embodiment used in the fourth embodiment has a higher electromechanical coupling coefficient. In this manner, simply by making the film thickness of the upper electrode larger than the film thickness of the lower electrode, a filter with a higher electromechanical coupling coefficient and a wider passband can be provided, without any degradation of characteristics.

Although the resonator 1 of the second embodiment is employed in a ladder filter in the fourth embodiment, it is also possible to employ resonators of the first embodiment or the third embodiment. Those resonators may also be employed in filters other than a ladder filter. In any case, the same effects as those of the fourth embodiment can be achieved. Although a protection film is not formed on the surface of the fourth embodiment, it is possible to employ a protection film.

In each of the first through fourth embodiments, the upper electrode 16 and the lower electrode 12 may be made of a material with high acoustic impedance, so as to improve the anti-resonant characteristics. The upper electrode 16 and the lower electrode 12 may also be made of a material with low electric resistance, so as to improve the resonant characteristics. The material with high acoustic impedance mostly contains at least either molybdenum (Mo) or ruthenium (Ru) used in the embodiments or at least one of the following materials: iridium (Ir), rhenium (Re), tungsten (W), rhodium (Rh), platinum (Pt), and tantalum (Ta). The material with low electric resistance mostly contains at least one of the following materials: silver (Ag), copper (Cu), gold (Au), and aluminum (Al). As in the first through fourth embodiments, the upper electrode 16 and the lower electrode 12 are made of the same material, so as to obtain a higher electromechanical coupling coefficient with higher certainty.

The piezoelectric film 14 in each of the first through fourth embodiments is made of aluminum nitride having an orientation with the (002) direction as the principal axis. Accordingly, a high-quality thin film can be obtained, and stable resonant characteristics can be achieved. For the same reasons, the piezoelectric film 14 may be made of zinc oxide (ZnO), instead.

Furthermore, the region 22, in which the upper electrode 16 and the lower electrode 12 sandwiching the piezoelectric film 14 face each other, has an oval shape. Accordingly, an unnecessary transverse mode that propagates in parallel with the planes of the upper electrode 16 and the lower electrode 12 and is reflected at the end portions of the upper electrode 16 and the lower electrode 12 can be restrained. Thus, resonant characteristics with fewer unnecessary spurious peaks can be obtained.

Furthermore, a via hole is formed through the bottom face of the substrate 10, thereby obtaining the void 18. However, the void 18 may be produced by forming a cavity through the upper face of the substrate, using a sacrifice layer. Although the first through third embodiments are examples of FBAR types, the present invention may be applied to a piezoelectric thin-film resonator of a SMR type. In such a case, the same effects as those obtained with the FBAR types can be achieved.

As described above, according to an aspect of the present invention, there is provided a piezoelectric thin-film resonator comprising: a lower electrode that is formed on a substrate; a piezoelectric film that is formed on the lower electrode; and an upper electrode that is formed on the piezoelectric film, the upper electrode having a greater film thickness than the lower electrode. With this structure, a piezoelectric thin-film resonator having a high electromechanical coupling coefficient can be provided simply by making the film thickness of the upper electrode larger than the film thickness of the lower electrode, without any degradation of the other characteristics.

The piezoelectric thin-film resonator may be configured so that $1<t1/t2<3$, with the film thickness of the upper electrode being t1, and the film thickness of the lower electrode being t2. With this structure, a piezoelectric thin-film resonator having a high electromechanical coupling coefficient can be provided.

The piezoelectric thin-film resonator may be configured so that: the upper electrode and the lower electrode mostly contain ruthenium (Ru); and $0.1<d1/d2<1$, with the sum of the film thicknesses of the upper electrode and the lower electrode being d1, and the film thickness of the piezoelectric film being d2. In accordance with the present invention, a piezoelectric thin-film resonator having a high electromechanical coupling coefficient can be provided, without an increase in resonant resistance.

The piezoelectric thin-film resonator may be configured so that the upper electrode and the lower electrode mostly contain at least one of iridium (Ir), rhenium (Re), tungsten (W), ruthenium (Ru), rhodium (Rh), platinum (Pt), tantalum (Ta), molybdenum (Mo), silver (Ag), copper (Cu), gold (Au), and aluminum (Al). (claim 4) With this structure, the anti-resonant characteristics or the resonant characteristics can be improved.

The piezoelectric thin-film resonator may be configured so that: a thin-film layer is provided under the lower electrode; and a thin-film layer is not provided on the upper electrode.

The piezoelectric thin-film resonator may be configured so that a thin-film layer is provided in at least one of a region under the lower electrode and a region on the upper electrode. With this structure, a piezoelectric thin-film resonator having a high electromechanical coupling coefficient can be provided even in a case where an etching stopper layer, an orientation control layer, a reinforcing layer, a frequency adjusting film, a protection film, or the like is employed.

The piezoelectric thin-film resonator may be configured so that the piezoelectric film is made of aluminum nitride or zinc oxide having an orientation with (002) direction as a principal axis. With this structure, a high-quality thin film can be obtained, and stable resonant characteristics can be achieved.

The piezoelectric thin-film resonator may be configured so that a region in which the piezoelectric film is interposed and the upper electrode and the lower electrode face each other has an oval shape. With this structure, resonant characteristics with fewer unnecessary spurious peaks can be obtained.

According to another aspect of the present invention, there is provided a filter comprising a plurality of piezoelectric thin-film resonators, each of the piezoelectric thin-film resonators being configured as mentioned above. Thus, a filter having a high electromechanical coupling coefficient and a wide passband can be provided simply by making the film thickness of each upper electrode larger than the film thickness of each lower electrode, without any degradation such as an increase in insertion loss.

As described above, the present invention can provide a piezoelectric thin-film resonator and a filter having an electromechanical coupling coefficient increased by a simple method, without any degradation of the other characteristics.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A piezoelectric thin-film resonator comprising:
    a lower electrode that is formed on a substrate;
    a piezoelectric thin film that is formed on the lower electrode; and
    an upper electrode that is formed on the piezoelectric thin film,
    wherein the upper electrode has a greater film thickness than the lower electrode, and wherein $0.1 < d1/d2$, with the sum of the film thicknesses of the upper electrode and the lower electrode being d1, and the film thickness of the piezoelectric film being d2.

2. The piezoelectric thin-film resonator as claimed in claim 1, wherein $1 < t1/t2 < 3$, with the film thickness of the upper electrode being t1, and the film thickness of the lower electrode being t2.

3. The piezoelectric thin-film resonator as claimed in claim 1, wherein:
    the upper electrode and the lower electrode mostly contain ruthenium (Ru); and
    $0.1 < d1/d2 < 1$, with the sum of the film thicknesses of the upper electrode and the lower electrode being d1, and the film thickness of the piezoelectric thin film being d2.

4. The piezoelectric thin-film resonator as claimed in claim 1, wherein the upper electrode and the lower electrode mostly contain at least one of iridium (Ir), rhenium (Re), tungsten (W), ruthenium (Ru), rhodium (Rh), platinum (Pt), tantalum (Ta), molybdenum (Mo), silver (Ag), copper (Cu), gold (Au), and aluminum (Al).

5. The piezoelectric thin-film resonator as claimed in claim 2, wherein:
    a thin-film layer is provided under the lower electrode; and
    a thin-film layer is not provided on the upper electrode.

6. The piezoelectric thin-film resonator as claimed in claim 1, wherein the piezoelectric thin film is made of aluminum nitride or zinc oxide having an orientation with (002) direction as a principal axis.

7. The piezoelectric thin-film resonator as claimed in claim 1, wherein a region in which the piezoelectric thin film is interposed and the upper electrode and the lower electrode face each other has an oval shape.

8. A filter comprising a plurality of piezoelectric thin-film resonators, each of the piezoelectric thin-film resonators comprising:
    a lower electrode that is formed on a substrate;
    a piezoelectric thin film that is formed on the lower electrode; and
    an upper electrode that is formed on the piezoelectric thin film,
    wherein the upper electrode has a greater film thickness than the lower electrode, and wherein $0.1 < d1/d2$, with the sum of the film thicknesses of the upper electrode and the lower electrode being d1, and the film thickness of the piezoelectric film being d2.

9. The piezoelectric thin-film resonator as claimed in claim 1, wherein a thin-film layer is provided in at least one of a region under the lower electrode and a region on the upper electrode.

* * * * *